United States Patent
Greco et al.

(10) Patent No.: US 7,468,124 B2
(45) Date of Patent: Dec. 23, 2008

(54) METHOD AND APPARATUS FOR COPPER CORROSION PREVENTION DURING WET CLEAN

(75) Inventors: Nancy A. Greco, Lagrangeville, NY (US); Kimberly F. Hooper, Fishkill, NY (US); Kevin S. Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 11/382,802

(22) Filed: May 11, 2006

(65) Prior Publication Data

US 2007/0261969 A1   Nov. 15, 2007

(51) Int. Cl.
 *C23F 13/04* (2006.01)
(52) U.S. Cl. ............... 205/727; 205/725; 205/726; 205/740; 205/96; 205/100; 205/775.5; 204/404; 204/196.02; 204/196.37; 204/228.1; 204/230.2
(58) Field of Classification Search .............. 204/404, 204/196.02, 196.37, 228.1, 230.2; 205/96, 205/100, 725, 726, 727, 740, 775.5
See application file for complete search history.

(56) References Cited

U.S. PATENT DOCUMENTS

| | | | |
|---|---|---|---|
| 6,558,529 B1 * | 5/2003 | McVey et al. | 205/787 |
| 7,160,582 B2 * | 1/2007 | Girard et al. | 427/437 |
| 2003/0034046 A1 * | 2/2003 | Guldi | 134/1.3 |
| 2003/0181342 A1 | 9/2003 | Seijo et al. | |
| 2006/0234855 A1 * | 10/2006 | Gorte et al. | 502/101 |

* cited by examiner

*Primary Examiner*—Bruce F Bell
(74) *Attorney, Agent, or Firm*—James Cioffi; Hoffman Warnick LLC

(57) ABSTRACT

A method and apparatus for cleaning a wafer with a metal exposed through an insulator, through the use of a wet cleaning tank in concert with a feedback system on the potential difference between two leads of the wet cleaning tank. The cleaning tank has a bath in which the wafer and the two leads are immersed. The potential difference between the two leads is regulated when the feedback system detects a change in the potential across the two leads.

14 Claims, 2 Drawing Sheets

METHOD AND APPARATUS FOR COPPER CORROSION PREVENTION DURING WET CLEAN

BACKGROUND OF THE INVENTION

1. Technical Field

The invention relates generally to a cleaning and etching process for wafers in semiconductor fabrication. More particularly, to methods and apparatus for preventing metal corrosion in an aqueous bath used in wet etching processes.

2. Background Art

Back end of the line (BEOL) structures, created on wafers, are subjected to an etching process to remove surface layers that are no longer needed after a particular step in the semiconductor fabrication process. The etching usually occurs in the presence of a plasma which results in residual particles/ions adhering to the surface of the wafers. During a wet clean rinse of these BEOL structures, corrosion of metal deposits or fillings, like copper or copper alloys, in lines and vias occurs, particularly for structures connected to n-type, p-type devices or structures connected down to the substrate.

When the wafers are immersed in a bath/solution to rinse off residual particles from reactive ion etching, the residual particles, which may be organic or inorganic materials, are released into the solution of the bath. These particles and the wafer carry a charge and a build-up of these particles and charges create an electrochemical effect transforming the bath into a galvanic cell. The transformed bath, as a galvanic cell has a high inherent affinity for positive ions. The metal deposits, exposed through a dielectric layer on the wafer, become a source for satisfying high affinity for positive ions. The tendency for metal deposits/fillings to dissolve is proportional to the electro-negativity of the solution. When wafers are immersed in the bath in batches, the depletion of metal deposits become more intense. The depletion of metals, for example, copper in the lines and vias of the BEOL structures compromises the yield of semiconductors devices. This is particularly evident for low-k dielectric materials after reactive ion etching. When wafers are cleaned in batches in the bath, the galvanic effect is accentuated and copper lined features are depleted at a greater rate.

In order to minimize the corrosive or galvanic effect during the wet clean rinse, ionic solutions or solutions of organic compounds, like that of benzotriazole (BTA) in deionized water, may be added to the bath. However this approach has its limitations in that the amount of BTA to be added will need to be varied according to the size and age of the bath as well as the batch sizes of wafers being rinsed. The type of wafers to be wet cleaned is also another factor to consider in varying the concentration of BTA added to the bath since different types of wafer have different requirements. For example, a different circuit design may require a different pattern density of the metal layer and changing the concentration of BTA in a single bath may be effective in neutralizing the galvanic effect for one BEOL structure but not for another of a different circuit layout design. It would not be efficient to have different bath compositions each time a different type of semiconductor product requires wet cleaning. Altering the concentration of the bath for accommodating multiple products also leads to difficulties with disposal and control.

In view of the foregoing, there is a need in the art for a solution to the problems of the related art.

SUMMARY OF THE INVENTION

The present invention includes a method and an apparatus for cleaning wafers using a batch wet cleaning tank with a feedback system on the potential difference of two leads of the wet cleaning tank. The two leads are immersed in a bath of the wet cleaning tank where a change in the concentration of the electrochemical ions is detected by the feedback system to enable adjustment in the concentration of the ionic solution of the bath or the potential applied at one of the two leads. In addition, one of the leads can be a sacrificial source of metal or material to neutralize the corrosion and/or galvanic effect.

A first aspect of the invention provides a method for preventing corrosion of metal deposits in back end of the line (BEOL) structures on a wafer during wet clean rinse, the method comprising: providing a bath in which the wafer is immersed for cleaning, the bath having at least two leads immersed therein; connecting a voltage regulator to the at least two leads to detect a change in potential difference therebetween; and regulating the potential difference through the voltage regulator by initiating a potential-regulating-process to maintain the potential difference at a fixed constant.

A second aspect of the present invention provides an apparatus for preventing corrosion of metal deposits in back end of the line (BEOL) structures on a wafer during wet clean rinse, the wafer having an exposed metal through a patterned insulator, the apparatus comprising: a bath in which the wafer is immersed for cleaning, the bath having at least two leads immersed therein; and a voltage regulator that connects the at least two leads to detect a potential difference therebetween, wherein the voltage regulator, on detecting a change in the potential difference, initiates a potential-regulating process to maintain the potential difference at a fixed constant.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
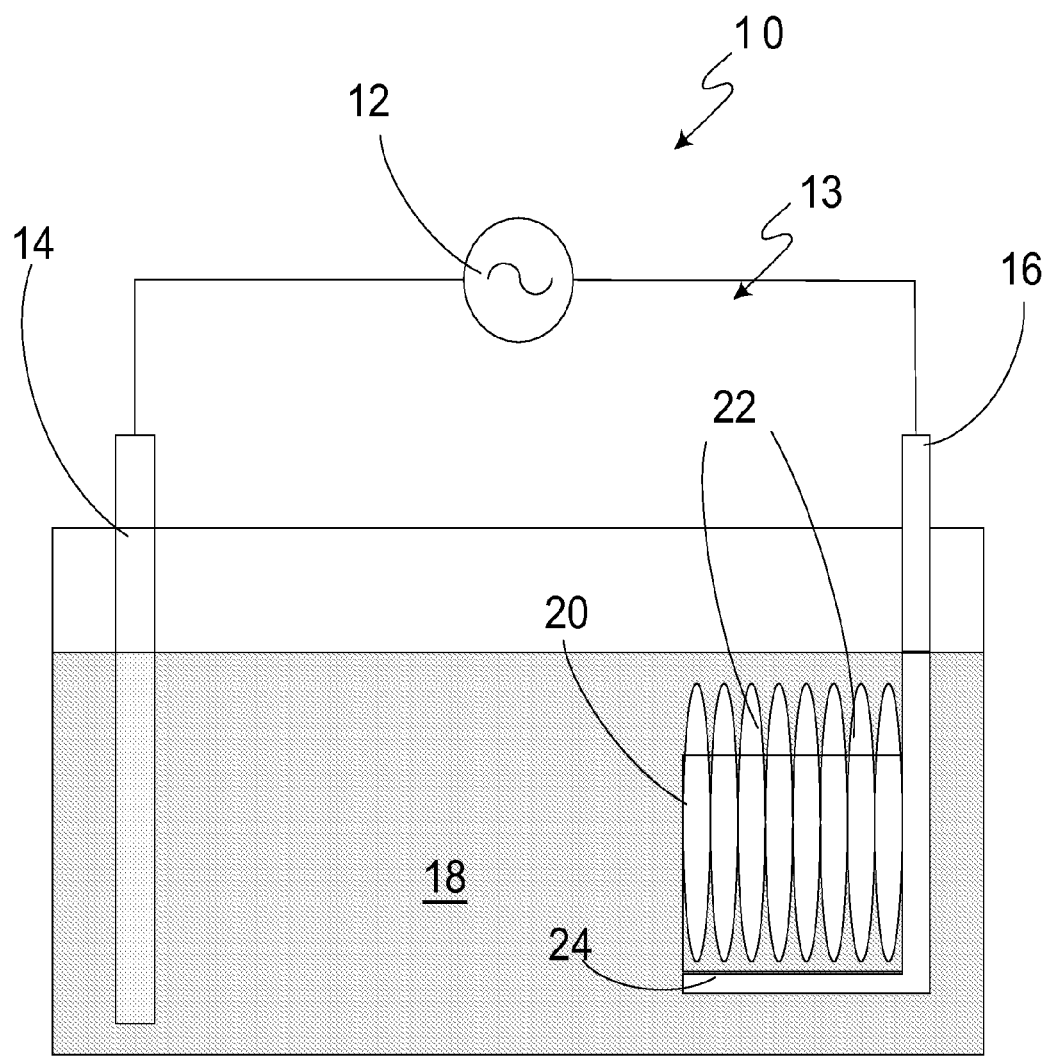
FIG. 1 is a sectional view of an apparatus using an embodiment of the present invention.
Figure 2:
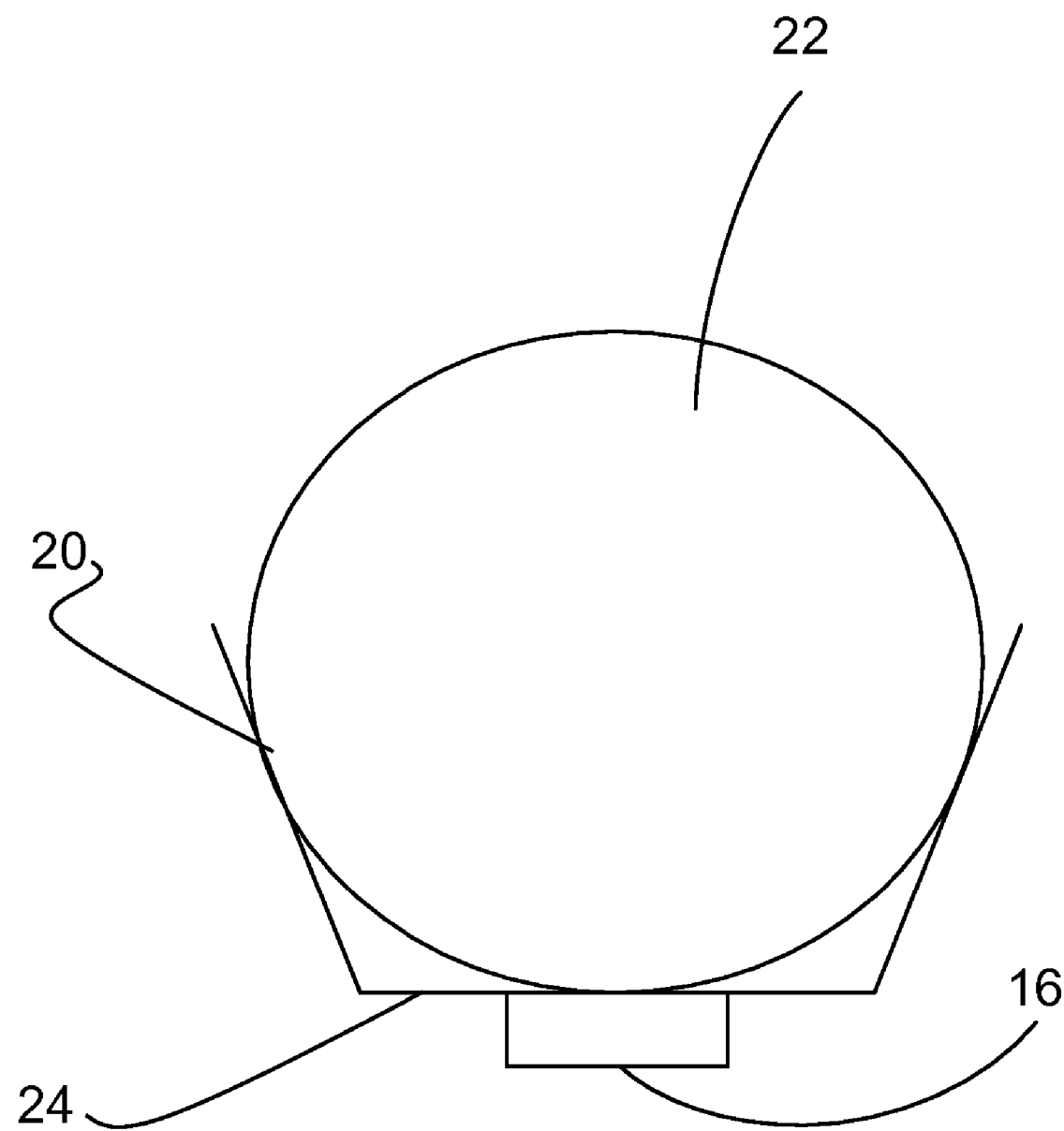
FIG. 2 is a plan view of a wafer carrier of an embodiment of the present invention.

FIGS. 1-2 illustrate a method and an apparatus of an embodiment of the present invention for minimizing the loss of copper deposits in back end of the line (BEOL) structures on a wafer in the process of wet cleaning following reactive ion etching.

FIG. 1 shows a wet cleaning tank 10 of an embodiment where a bath 18 is provided in which a wafer carrier 20 is immersed. Wafer carrier 20 carries wafers 22 that have been subjected to an etching process (not shown) and has a cathode 16 connected to a base 24 of wafer carrier 20, as shown in FIG. 2. Cathode 16 may be configured in an L-shape that runs along one side of wafer carrier 20 through base 24 such that cathode 16 is in close proximity to wafers 22. Alternatively, cathode 16 may take any other shape or form that defines a close proximate relation with wafers 22. On another end of the cathode 16 is connected, through a voltage regulator 12, anode 14. Anode 14 is positioned away from the wafer carrier 20 as compared to cathode 16. Together the two leads (i.e., the anode 14 and cathode 16) and voltage regulator 12 form a feedback system 13. Feedback system 13 is used to monitor the potential difference between anode 14 and cathode 16. When a new batch of wafers 22 on wafer carrier 20 is immersed into bath 18, any change in the potential difference between anode 14 and cathode 16 may be detected by voltage regulator 12. This change in potential difference indicates a likely increase in charged ions released into bath 18 from residual organic or inorganic particles and/or charge build up on wafers 22 post etching. The change in potential difference triggers a potential-regulating-process which may take the form of an adjustment of the potential applied at anode 14. The adjustment may be an increase or decrease in the voltage at anode 14 to neutralize any galvanic effect caused by negatively charged residual particles released into bath 18. Feedback system 13 provides for real time adjustment to either increase or decrease the release of positive ions into the solution of bath 18. With bath 18 kept at an electrochemically neutral state, the chances of depletion of exposed metal or copper through a patterned insulator on wafers 22 is minimized.

An example of materials used as anode 14 is copper (Cu), aluminum (Al), platinum (Pt) or alloys of copper, alloys of aluminum or alloys of platinum. Anode 14 provides a source of charged ions to substitute for the copper deposits on wafers 22. When anode 14 is kept outside of bath 18 for a period of time, anode 14 is submerged in a solution of 10% sulfuric acid in deionized water in the presence of benzotriazole (BTA). Besides BTA, 5-methylbenzotriazole (5-MeBTA) and methylbenzotriazole (MeBTA) may also be used.

As BTA has an affinity for copper (Cu), adhering to any exposed copper surface to form a monolayer, it serves as an effective protective film over copper deposits in BEOL structures, which may potentially be corroded when immersed in a bath for wet clean rinse. Bath 18 may also contain the organic compounds of BTA, 5-MeBT and/or MeBT, which also adhere to the copper to form a protective monolayer for preventing corrosion of copper when wafers are immersed into bath 18. Another alternative is isopropyl alcohol which is usually sprayed onto the surface of wafers prior to immersing into the bath to cure risks of oxidation at the surface of copper.

Alternatively, the potential-regulating-process for neutralizing charges carried over from the etching process on wafers 22 takes the form of injecting an additive into cleaning bath 18 to alter the concentration of ions in bath 18. The electrochemical neutrality with respect to the exposed metal below the insulator to be wet cleaned is maintained. The additive may be an acid like carboxylic acid which serves to maintain a preferred level of resistivity in the solution of bath 18 so as to prevent the corrosion of copper on wafers 22. Alternatively, a solution of benzotriazole (BTA) with a concentration of less than 5 grams per liter is added in arbitrary amounts until the potential difference between the two leads is reverted to a neutral state. The use of BTA in solution is effective in real time adjustment of the potential difference as the change in electro-negativity is immediate in proportion with the amount of BTA solution added to bath 18.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method for preventing corrosion of metal deposits in back end of the line (BEOL) structures on a wafer during wet clean rinse, the method comprising:
    providing a bath in which the wafer, accommodated by a wafer carrier, is immersed for cleaning, the bath having at least two leads immersed therein wherein a first of the at least two leads is in close proximity to a base of the wafer carrier accommodating the wafer and a second of the at least two leads is positioned further away from the wafer carrier in relation to the first of the at least two leads;
    connecting a voltage regulator to the at least two leads, wherein the voltage regulator detects a change in potential difference between the at least two leads; and
    regulating the change in the potential difference through the voltage regulator, wherein the voltage regulator initiates a potential-regulating-process to maintain the potential difference at a fixed constant.

2. The method according to claim 1, wherein the potential-regulating-process includes changing an applied potential at one of the at least two leads.

3. The method according to claim 2, further comprising adjusting the potential at one of the at least two leads in real time.

4. The method according to claim 1, wherein the potential-regulating-process includes changing a concentration of ions in the bath by injection of a chemical.

5. The method according to claim 1, wherein the at least two leads include an anode and a cathode.

6. The method according to claim 5, wherein the first of the at least two leads is a cathode is positioned in close proximity to the wafer.

7. The method according to claim 5, wherein the second of the at least two leads is an anode is positioned further away from the wafer in relation to the cathode.

8. The method according to claim 1, wherein the bath includes a solution of organic compounds selected from a group consisting of: benzotriazole (BTA), 5-methylbenzotriazole (5MeBT) and methylbenzotriazole (MeBT).

9. The method according to claim 8, wherein the solution of organic compounds forms a protective monolayer on an exposed surface of the metal deposits in the BEOL structure.

10. An apparatus for preventing corrosion of metal deposits in back end of the line (BEOL) structures on a wafer during wet clean rinse, the wafer having an exposed metal through a patterned insulator, the apparatus comprising:
    a bath in which the wafer is immersed for cleaning, the bath having at least two leads and a wafer carrier for accommodating the wafer immersed therein, wherein a first of the at least two leads is in close proximity to a base of the wafer carrier accommodating the wafer and a second of the at least two leads is positioned further away from the wafer carrier in relation to the first of the at least two leads; and
    a voltage regulator that connects the at least two leads to detect a potential difference between the at least two leads, wherein the voltage regulator, on detecting a change in the potential difference, initiates a potential-regulating process to maintain the potential difference at a fixed constant.

11. The apparatus of claim 10, wherein the at least two leads includes an anode and a cathode.

12. The apparatus of claim 11, wherein the first of the at least two leads is a cathode is positioned in close proximity to the wafer via the wafer carrier.

13. The apparatus of claim 11, wherein the second of the at least two leads is an anode is positioned farther away from the wafer in relation to the cathode.

14. The apparatus of claim 11, wherein the anode is fabricated from a material selected from a group consisting of: copper, aluminum, platinum, and alloys thereof.

* * * * *